(12) United States Patent
Cop (10) Patent No.: US 7,750,663 B2
(45) Date of Patent: Jul. 6, 2010

(54) METHOD AND APPARATUS FOR TESTING AN ELECTRONIC MOTOR

(75) Inventor: Boris Cop, Helsingborg (SE)

(73) Assignee: Subsee AB, Raa (SE)

( * ) Notice: Subject to any disclaimer, the term of this patent is extended or adjusted under 35 U.S.C. 154(b) by 249 days.

(21) Appl. No.: 11/568,409

(22) PCT Filed: Apr. 29, 2005

(86) PCT No.: PCT/SE2005/000634

§ 371 (c)(1),
(2), (4) Date: Aug. 20, 2008

(87) PCT Pub. No.: WO2005/106514

PCT Pub. Date: Nov. 10, 2005

(65) Prior Publication Data

US 2008/0303543 A1    Dec. 11, 2008

(30) Foreign Application Priority Data

Apr. 29, 2004    (SE) .................................... 0401128

(51) Int. Cl.
*G01R 31/34* (2006.01)
(52) U.S. Cl. .................................... 324/772
(58) Field of Classification Search ....................... None
See application file for complete search history.

(56) References Cited

U.S. PATENT DOCUMENTS

| 5,488,281 | A |   | 1/1996 | Unsworth et al. |
| 5,680,059 | A | * | 10/1997 | Shiota et al. ................ 324/772 |
| 6,393,373 | B1 |   | 5/2002 | Duyar et al. |
| 2001/0013792 | A1 |   | 8/2001 | Kliman et al. |

FOREIGN PATENT DOCUMENTS

EP    0274691    7/1988

* cited by examiner

*Primary Examiner*—Minh N Tang
(74) *Attorney, Agent, or Firm*—Volpe and Koenig, P.C.

(57) ABSTRACT

An apparatus for testing an electric motor is described. The motor comprises stator windings and a rotor arranged along a rotation axis. The apparatus is adapted to measure a physical quantity of the stator winding while the rotor is being rotated about the rotation axis, whereby periodic measuring data concerning the physical quantity are obtained. The apparatus is adapted to collect measuring data concerning at least two periods of the periodic measuring data, to compare the symmetry between at least the fundamentals of two or more half-cycles of the collected data and to generate a signal that indicates the symmetrical relation between at least the fundamentals of two or more half-cycles of the collected measuring data.

4 Claims, 5 Drawing Sheets

METHOD AND APPARATUS FOR TESTING AN ELECTRONIC MOTOR

FIELD OF THE INVENTION

The present invention relates to an apparatus and a method for measuring and analysing/detecting different types of rotor and stator faults in induction motors and asynchronous motors.

BACKGROUND ART

Electric motors have a wide field of application. In industrial production, for example, electric motors are used to drive pumps, conveyor belts, overhead cranes, fans, etc. An electric motor, adapted for use in a specific application, offers the user many advantages, mainly owing to its long life and limited need for maintenance. One basic requirement for a long electric motor life is that the rotor in the electric motor does not have any faults or defects. Common types of rotor faults are, for example, breaks or cracks/fractures in a rotor bar, excessively high resistance in welded or soldered joints in the rotor, excessively large air cavities (as a result of the casting of the rotor) and rotor offset in air gaps relatively to the stator. Common types of stator faults are, for example, insulation faults between the turns of a winding, insulation faults between windings in the same phase, insulation faults between windings in different phases, insulation faults between windings and earth/motor casing, contaminated windings (i.e. impurities such as moisture, dust, or insulation charred due to overheating), an open turn of a winding in a delta-connected motor as well as contact problems between the winding ends and external connections.

When measuring electric three-phase motors, it is common to measure current fundamental components during operation and to compare measurement data from the three phases. Usually, special sensors are used in these measurements to obtain measurement data.

Measuring methods carried out during operation are sensitive to disturbances in the power grid, i.e. fundamentals generated by other machines (for example switched power supply units, fluorescent tube fittings, etc.) that are connected to the same power grid. These disturbances cause erroneous measuring results and may even make measurements on the electric motor impossible.

When measuring stators according to prior art, a powerful surge voltage with high energy content is supplied to the motor, following which the exponentially decaying response obtained is analysed to identify possible faults in the stator. This measuring method has many disadvantages: it is a destructive method that may initiate or accelerate/bring to completion incipient insulation failures; it requires time-consuming and complex calculations and interpretations/analyses; it causes problems of pulse propagation in the winding due to L and C effects; it requires bulky and heavy equipment associated with transport/installation problems; and it is an expensive method.

SUMMARY OF THE INVENTION

One object of the present invention is to provide a method for safe checking of electric motors. More specifically, a method when checking an electric motor, which comprises stator windings and a rotor arranged along a rotation axis, is provided, the method comprising measuring a physical quantity of the stator winding while the rotor is being rotated about the rotation axis, thereby obtaining periodic measuring data concerning the physical quantity. The method comprises collecting measuring data concerning at least two periods of the periodic measuring data, comparing the symmetry between at least the fundamentals of two or more half-cycles of the collected measuring data and generating a signal, which indicates the symmetrical relation between at least the fundamentals of two or more half-cycles of the collected measuring data.

A measuring device according to the present invention measures the current (I), impedance (Z) or inductance (L) of a stator winding in real time while the position of the rotor relatively to the stator is being changed in fixed steps or by continuous rotation. In addition, the apparatus displays the resulting relationship/waveform on a graphic screen in real time. The relationship can be considered to be the measure of how the relative inductance between the rotor and stator varies. In the majority of all three-phase asynchronous motors, there is a sinusoidal relationship between the rotor position (X) and the value of I, Z or L on the stator (Y). This pattern includes a fundamental that is periodic/cyclic and symmetric about the x-axis in each phase. Certain harmonic components and/or disturbances may also be superposed on the periodic fundamental. Moreover, the number of cycles/periods per turn depends on the number of poles of the motor.

Although the relationship is not always purely sinusoidal depending on, for example, stator windings having different structures and positions in relation to one another, it is always characterised in that it is cyclic and symmetric about the x-axis if the rotor is intact.

Furthermore, the waveforms mentioned above are analysed with regard to symmetry/uniformity within one or more (and between two) periods/cycles, and to determine if any deviation is greater or smaller than predetermined criteria for rotor faults.

All common types of rotor faults are reflected in some kind of effect on the symmetry/uniformity of the waveform that is normal for the motor type.

Common types of rotor faults are, for example:
a) breaks or cracks/fractures in a rotor bar,
b) excessively high resistance in welded or soldered joints in the rotor,
c) excessively large air cavities (following the casting of the rotor),
d) rotor offset in air gaps relatively to the stator.

Furthermore, a method when checking an electric motor, which comprises two or more stator windings, is provided, the method comprising measuring a physical quantity of the stator windings, thereby obtaining measuring data concerning the physical quantity. The method comprises comparing measuring data concerning the physical quantity, which measuring data have been measured for at least two stator windings, and generating a first signal, which indicates the relation between the measuring data measured for the at least two stator windings. Moreover, a representation of the generated first signal is displayed on a screen, the representation of the generated first signal being displayed in the form of three or more graphic figures disposed side by side. A difference between the measuring data obtained can be illustrated on the screen as a deviation of at least one of the graphic figures from an otherwise straight line comprising two or more graphic figures. According to the method, a user may select at least one graphic symbol, numeric measuring data for the at least one graphic symbol being shown on the screen.

BRIEF DESCRIPTION OF THE DRAWINGS

The present invention is further described hereinafter with reference to the accompanying drawings, which show an embodiment of the invention as a non-limiting example.

DETAILED DESCRIPTION

Figure 1:
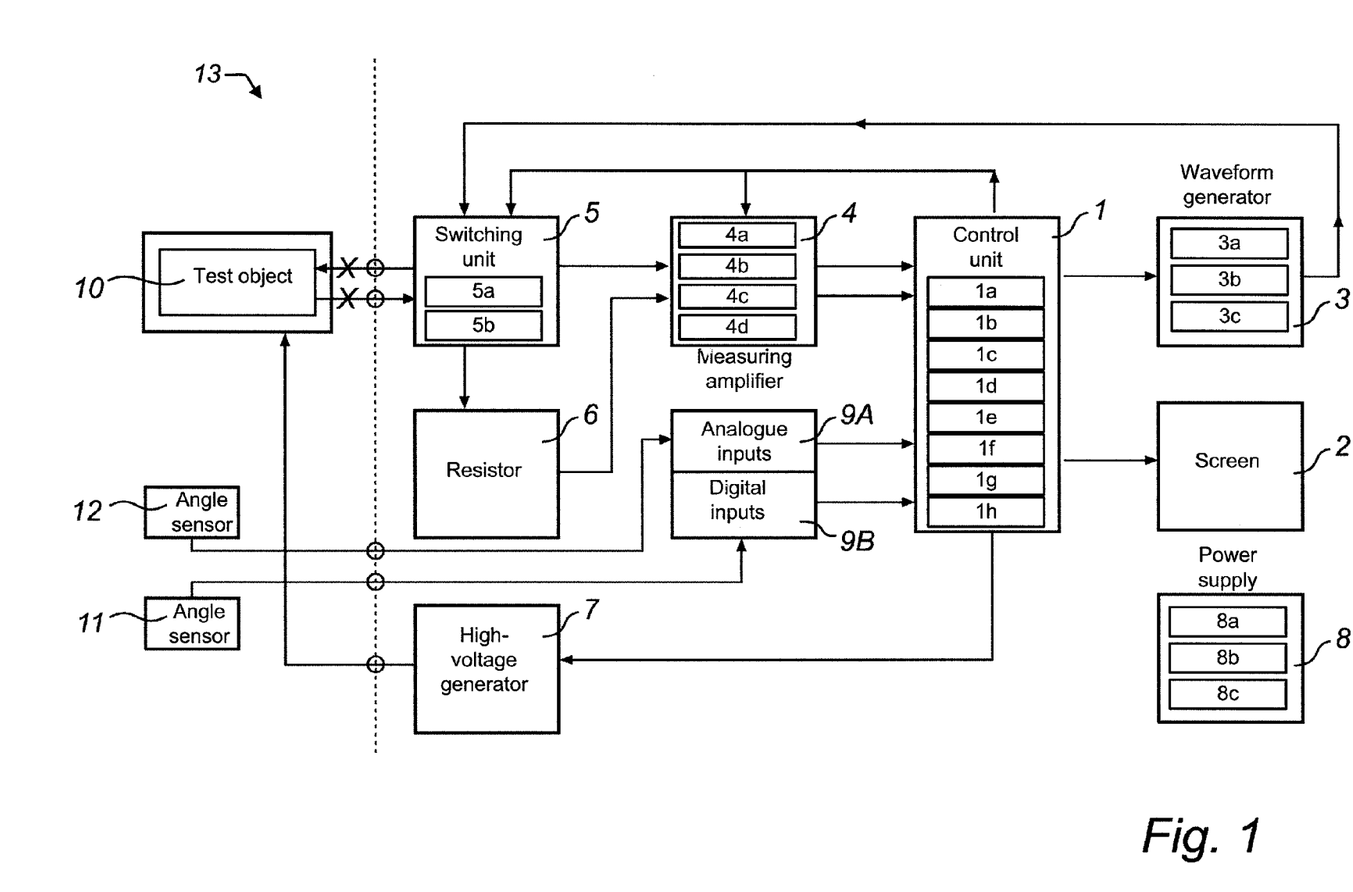
FIG. 1 is a block diagram of a preferred embodiment of a measuring device according to the present invention.

Referring to the block diagram in FIG. 1, a preferred embodiment of a measuring device 13 according to the present invention will be described. The measuring device 13 comprises a control unit 1, which preferably comprise: a CPU 1*a*, a program memory 1*b*, a data memory 1*c*, an A/D converter 1*d*, a voltage reference 1*e*, a first timer (A) 1*f*, a second timer (B) 1*g* and a hardware multiplier 1*h*.

The measuring device 13 comprises a screen 2, which is connected to the control unit 1.

The measuring device 13 comprises a waveform generator 3 connected to the control unit, which preferably comprises: a D/A converter 3*a*, a reconstruction filter 3*b* and a power amplifier 3*c*.

The measuring device 13 comprises measuring amplifiers 4 in two channels, which preferably comprise: adjustable amplifiers 4*a*, rectifiers 4*b*, zero detectors 4*c* and level shifters 4*d*.

The measuring device 13 comprises a switching unit 5 for providing inputs and outputs to a test object 10. The switching unit, which is connected to an input of the measuring amplifier 4, preferably comprises relays 5*a* and analogue multiplexers 5*b*.

Furthermore, the measuring device 13 comprises a reference measuring resistor 6, which is connected between the switching unit 5 and an input of the measuring amplifier 4.

A high-voltage generator 7 is connected between the test object 10 and the control unit 1 for testing the insulation resistance of the test object 10. The high-voltage generator preferably produces a voltage on its output in the range of 500 V-1 kV.

The measuring device 13 comprises a power supply device 8, which preferably comprises one or more batteries 8*a*, battery charging device 8*c*, one or more voltage regulators 8*c* and an LCD biasing generator.

Moreover, the measuring device preferably comprises one or more analogue inputs 9A and digital inputs 9B. The control unit 1 monitors and controls the screen 2, the waveform generator 3, the measuring amplifiers 4, the switching unit 5, the reference measuring resistor 6, the high-voltage generator 7 and the power supply device 8, in accordance with program instructions stored in the memory 1*b*, and records and calculates output data according to given program instructions, the result being illustrated on the screen 2. More specifically, the control unit 1 controls the waveform generator 3 to generate a DC signal or a sinusoidal signal, whose frequency is preferably in the range of 25-800 Hz and whose voltage is preferably 1 V rms. The generated voltage is applied to the test object 10 via power amplifiers 3*c* and the switching unit 5. The current thus generated causes a voltage across the measuring resistor 6, the measuring amplifier 4 being controlled to measure the voltage across the measuring resistor 6 and the test object, respectively.

A first input of a first zero-crossing detector 4*c* is connected to the output of the waveform generator 3. The output represents the phase displacement of the voltage across the test object 10. A second zero-crossing detector 4*c* is connected to the output of the amplifier 4*a* whish is adjustable to match the measuring resistor 6, and its output signal represents the phase displacement of the current through the test object 10.

The above connection allows the current (I) trough the test object 10 to be calculated. It also allows the impedance (Z), inductance (L) and resistance (R) to be calculated. When measuring and calculating R in connection with an insulation test, the high-voltage generator 7 is used instead of the waveform generator 3. The phase angle Fi is also measured. The program instructions required by the control unit 1 to carry out the above measurements/calculations are stored in the memory 1*b*.

A rotor test according to the present invention can be effected in two alternative ways. According to alternative 1, a constant rotor speed is maintained to match the sweep time for viewing and calculation. According to alternative 2, the shaft position is included in the measurement by means of an angle sensor 11 and a digital input 9*b*, thereby connecting the measurement value with the rotor position.

More specifically, in a rotor test according to alternative 1 the rotor position influences the measured value of the current (I), the impedance (Z), the inductance (L) and the phase angle (Fi) in the stator windings. The measured values vary between min/max, symmetrically in proportion to the position of the rotor relatively to the stator. By measuring I, Z, L and Fi in the stator winding during rotation and calculating this symmetry any rotor unbalance present will be detected.

Provided that the collection of measuring data is linear over time and that the rotor is rotated at a constant speed adapted to the measuring data acquisition rate, the result is a graphic geometric representation for calculating and illustrating the measured values on the screen 2.

In a rotor test according to alternative 3, in which an angle sensor 11 is connected to the shaft, the measured value is connected with the rotor position, the position thereby being the controlling factor in the horizontal direction.

Referring to the flow chart in FIG. 2 (Sheets 1 and 2), a preferred measuring method according to the present invention will be described.

Figure 2:
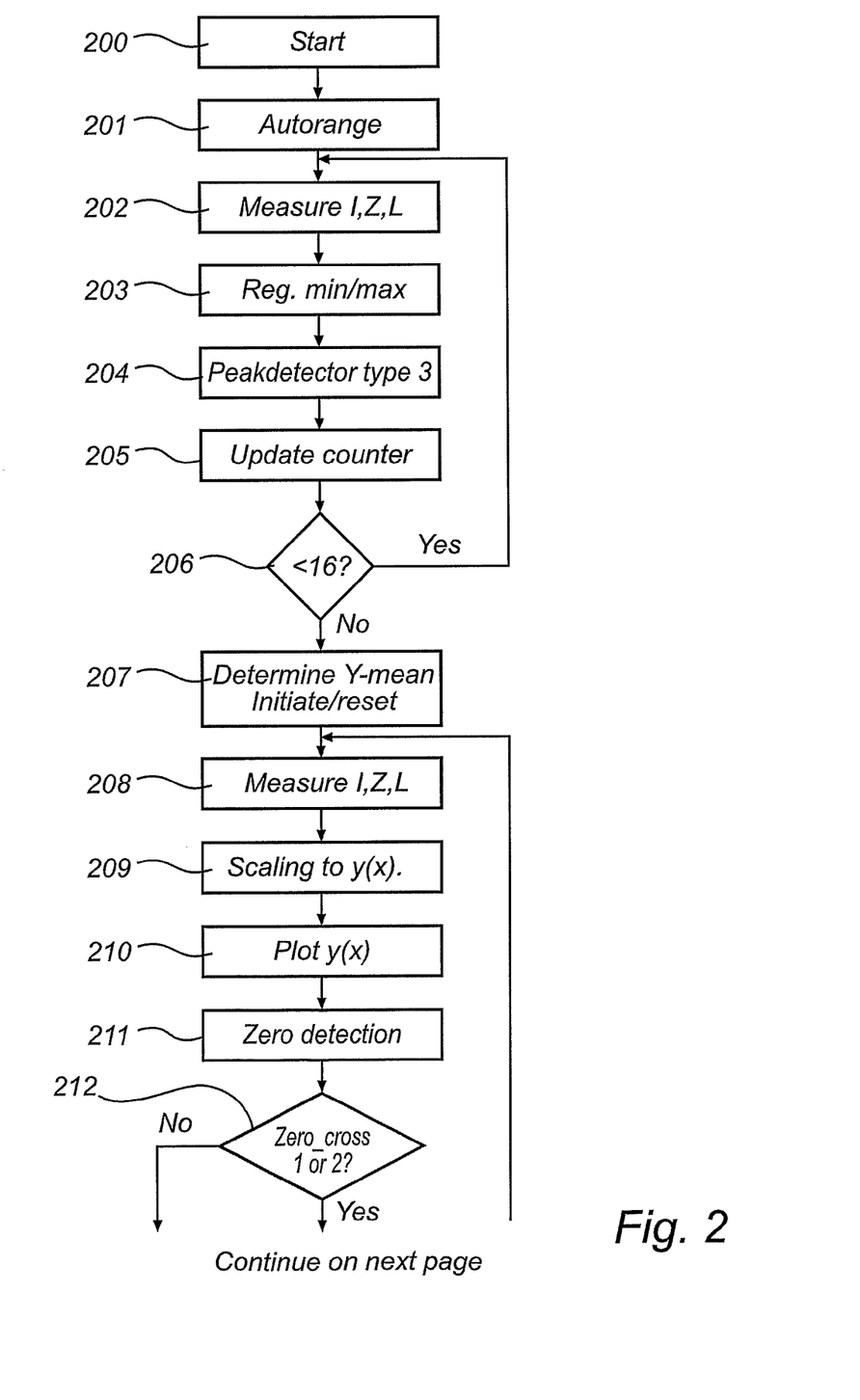
FIG. 2 is a flow chart of a measuring method according to an embodiment of the present invention.

In the first step 200, the waveform generator 3 is started, thereby generating a measuring signal 25-800 Hz, 1 V rms, and connected via power amplifier 3*c* and switching unit 5 to the test object 10 and the measuring resistor 6 optionally via connector terminals (indicated by X in FIG. 2). More specifically, the waveform generator 3 is started by starting the timer (B) 1*g* and uploading a value corresponding to a sampling time t1. When the timer has counted down to zero, an interrupt is generated which causes the CPU 1*a* to retrieve/look up the value of sample no. 1 in a table stored in the program memory 1*b*, the value being supplied to the D/A-converter 3*a*. At the same time, the timer (B) 1*g* is restarted and reloaded with the value of t1.

This process is repeated in connection with/after each interrupt of timer (B) 1*g* by retrieving the next sample in the program memory 1*b* and supplying it to the D/A-converter 3*a*, thereby generating a series of discreet voltage levels representing the desired waveform plus the sampling frequency 1/t1. This signal is then sent to a low-pass/reconstruction filter 3b, the function of which is to filter out the sampling frequency and any non-desirable frequency components, so that only the desired waveform remains. Before the waveform can be applied to the test object 10 impedance matching has to be effected. This takes place in the power amplifier 3c from which the waveform is relayed to the test object 10 via relays in the switching unit 5.

In step 201, the voltage across the test object 10 and the measuring resistor 6, respectively, is registered in the measuring amplifier 4 (autorange). This is effected by the CPU 1a setting the relays 5a and multiplexors 5b in the switching unit 5 so that the voltage across respectively the test object 10 and the measuring resistor 6, which are connected in series, is switched to a respective adjustable amplifier 4a, 4b. The CPU sets the amplifiers 4a, 4b to the lowest amplifying level. The signals are then sent to rectifiers 4c in which they are subjected to full-wave rectification, following which they are each supplied to a level shifter 4e, which adapts the levels to the A/D converter 1d. In this amplifying and switching state, the CPU 1a starts the A/D converter 1d, which together with the voltage reference 1e via a software-based peak value detector type 1, which will be described in more detail below, returns the peak voltage of both signals. Using these peak values, the CPU 1a selects/calculates an optimal amplifying level for the adjustable amplifier of each channel and applies them. In these new amplifying states, the CPU 1a again starts the A/D converter 1d, which together with the voltage reference 1e via a software-based peak value detector type 1, returns the peak voltage of both signals. Using these peak values, the CPU 1a verifies that the optimal amplifying state for the adjustable amplifier of each channel has been obtained. If this is not the case, i.e. if any one channel is overdriven the CPU 1a may reduce the amplifying level by one step and apply the same. Alternatively, the signal across the measuring resistor can be so low that the CPU interprets this as if no test object were connected. Preferably, the maximum amplitude of the waveform generator 3 is also known.

The input of the first zero-crossing detector is connected to the output of the waveform generator 3. The output signal can be said to represent the phase displacement of the voltage across the test object 10. The second zero-crossing detector is connected to the output of the adjustable amplifier adapted for the measuring resistor 6 and its output signal represents the phase displacement of the current through the test object 10.

Step 202 comprises measuring I, Z or L. The method of measurement used is method a or b, as described below, or a combination thereof.

In measuring method a), a software-based peak value detector type 1 is used, i.e. the detector uses a back-up signal related to the zero crossings of the measuring signal to determine the peak value of the measuring signal.

In measuring method b), a software-base peak value detector type 2 is used, which means measuring without a back-up signal. Both measurements are time-synchronised with the waveform, which thus forms the time base of the whole measuring sequence (1 measuring cycle=1 waveform period).

Step 203 comprises initialising registration/memorizing of minimum and maximum values of I, Z and/or L.

Step 204 comprises carrying out a software-based peak value detection type 3 without a back-up signal to detect a number of min/max cycles in the waveform resulting from the rotor signature envelope. A peak value detector type 3 is based on essentially the same software algorithm as a type 2, but differs in terms of the indata and waveform processed. The indata for a peak value detector type 3 is the measurement result from one or more measuring cycle, i.e. output data from a peak value detector type 1 or type 2 (1 test cycle=1 waveform generator period; 1 measurement result=the result of one or more averaging test cycles). The waveform measured, on the basis of which the min/max values are obtained, is the rotor signature envelope, which is of sinusoidal or other shape, which appears from the envelope after a sufficiently large number of collected measurement results.

Step 205 comprises updating the counter with regard to the number of min/max cycles.

Step 206 comprises determining if the number of min/max cycles<16. If this is the case, the routine returns to step 202. If not, the routine continues with step 207.

Figure 3:
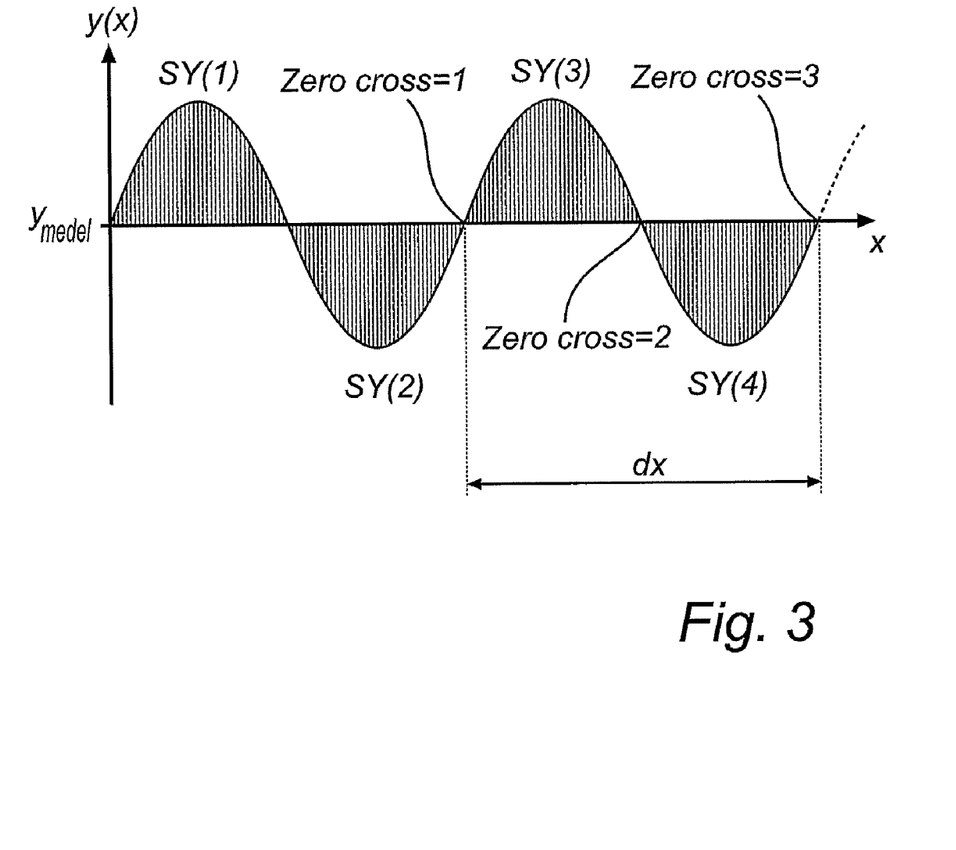
FIG. 3 illustrates half cycles SY(1) to SY(4) used for determining the symmetry factors S1 to S3.

Step 207 comprises calculating the Y-mean based on the measured min/max values. This step also comprises initialising and/or setting to zero specific variables, for example dx=1, SY(1)=0, SY(2)=0, SY(3)=0 and SY(4)=0, the significations of which are shown in FIG. 3.

Step 208 comprises starting the main measurement loop of the rotor test, wherein I, Z and/or L is measured according to measuring method a) or b) or a combination thereof. The time between two x (the time when the test result from one or more test cycles is ready, each test cycle having been sampled and A/D converted) is a multiple of 1 test cycle (i.e. one waveform period).

Step 209 comprises scaling I, Z and/or L to y(x).

Step 210 comprises plotting y(x) on the display 2 to allow visual checking of waveforms.

Step 211 comprises executing a software-based zero-crossing detection to obtain information regarding where the measuring data crosses the x axis.

Step 212 comprises determining if zero_cross=1 or 2 according to the graph in FIG. 3. If zero_cross=1 or 2, the routine proceeds with step 213, if not the routine proceeds with step 214.

Step 213 comprises adding the current measurement value y(x) to the correct range of values and increasing dx, i.e.:

dx++
if y(x)>y_mean
   SY(3)=SY(3)+y(x)
if y(x)<y_mean
   SY(4)=SY(4)+y(x)

Step 214 comprises checking if zero_cross=3. If this is the case, the routine proceeds with step 215. If not, the routine proceeds with step 221.

Step 215 comprises determining the symmetry factors S1, S2, S3 and increasing dx, i.e.:

dx++

$$S1 = \frac{||SY(3)| - |SY(4)||}{K1} 100 \frac{K2}{dx}$$

$$S2 = \frac{||SY(3)| - |SY(1)||}{K1} 100 \frac{K2}{dx}$$

$$S3 = \frac{||SY(3)| - |SY(2)||}{K1} 100 \frac{K2}{dx}$$

S1 is a measure/comparison of the symmetry between the half-cycles 3 and 4 in the current cycle. S2 is a measure/comparison of the symmetry between the half-cycle 3 in the current cycle and the "negative" half-cycle 2 in the immediately preceding cycle stored. S3 is a measure/comparison of the symmetry between the half-cycle 3 in the current cycle and the "negative" half-cycle 2 in the immediately preceding cycle stored. K1 and K2 are constant form factors and K2/dx is a compensating factor for different rotation speeds where dx=the number of x from zero crossing 1 to 3.

Step 216 comprises selecting the symmetry factor S1, S2 or S3 having the largest value, i.e.:
if S2>S1
S1=S2
if S3>S1
S1=S3

Step 217 comprises displaying the result of the largest value S1 on the screen 2.

Step 218 comprises determining if S1 is larger or smaller than 5. It also comprises updating counters for rotor_ok and rotor_fault, i.e.:
if S1>5
rotor_fault++
rotor_ok=0
if S1<5
rotor_ok++

Step 219 comprises saving the latest period as:
SY(1)=SY(3)
SY(2)=SY(4)

Step 220 comprises initialising and/or setting to zero specific variables for a new period, for example: dx=1, SY(3)=0, SY(4)=0.

Step 221 comprises increasing x. In this connection, xmax and rotor_fault and rotor_ok counters are checked, i.e.:
x++
if x>xmax_display
x=0
if rotor_ok >=8
print<5
beep
if rotor_fault>=16
print>5
beep In step 222, the routine returns to step 208, and the main measurement loop restarts.

In the following, an example of a stator measurement according to the present invention will be described.

The measuring lines of the apparatus are connected to a delta or Y coupled motor with three phase connections, referred to below as A, B, C, and a connection to earth/motor casing (GND).

Measurements of all quantities are effected between connections A-B, B-C and C-A, at all measuring frequencies f1, f2, f3 . . . fn, except the insulation resistance which is measured between A-GND with a test voltage of 500 V or 1000 V.

The main object of the tests/measurements is preferably not to study the absolute measurement values as such, but rather to study the resulting patterns and symmetry deviations caused by the different faults. In doubtful cases, the rotor should be rotated 90 degrees and the measurement carried out once more.

The apparatus starts by an automatic change-over of measurement inputs for the purpose of measuring any interference voltage level (Uemi) possibly induced in the motor due to external interference fields, if any. If the level is too high, it is displayed on the screen of the apparatus, thereby allowing the user to take different measures in an attempt to reduce the interference level, for example grounding the test object to earth, etc. Thus, the ability of the apparatus to determine excessive interference voltage levels (Uemi) is a highly advantageous feature, since an excessive interference voltage level causes erroneous measurement results.

If the interference level is sufficiently low, the apparatus proceeds, preferably automatically, by measuring and/or calculating the following quantities:

Resistance (R), which is used to detect breakage in connectors or windings, loose connections, contact resistance and direct short circuits.

Impedance (Z) and Inductance (L), which are used in combination to detect the presence of different impurities in the windings. These may be, for example, in the form of dust, moisture or charred insulation (due to overheating), which all cause small changes in the capacitance of the winding being measured. In most cases, the capacitance increases, which causes a reduction of the impedance Z. Moreover, the capacitive reactance will have a greater influence on the impedance (Ohm's law), since the test signal applied has low amplitude and the capacitance value therefore is even more dominant.

In the case of insulation charred due to overheating, the capacitance may instead decrease, thereby causing the impedance to increase in one or more phases.

Of all the measurement quantities, the inductance L is the one least likely to change due to a fault in the stator. Owing to this "inertia" the measurement results for L can be used as a form of reference or base line for comparison with changes in Z.

However, depending on the motor type the values of L and Z will unfortunately vary to different degrees between the phases. The reason for this variation is that the effect of the rotor position on the relative inductance between the rotor and the stator may be different in each phase.

One important feature in a motor without any other faults is that, despite these variations, the values and deviations of Z and L will still essentially follow one another in parallel in each phase. One important conclusion that can be drawn from the above reasoning is that the non-desirable effect of the rotor position on the phase balance in the values of Z and L is eliminated by studying the combined relationship.

It follows from the above that if the pattern shows that Z and L are not parallel because of an increase or decrease in Z in one or more phases, this is an indication of a probable contamination in one or more stator windings. If, however, Z follows the other measurands but L deviates, this indicates some kind of rotor fault and the need for a special rotor test to be carried out for the purpose of a closer analysis.

Phase angle (Fi) and IF or ZF, which are used in combination or separately to detect different insulation faults in stator windings. When a fault occurs in a winding, the effective capacitance in the complete circuit is changed. This capacitance change will directly affect the delay of the current relatively to the voltage, the common result being an increase of the capacitance and a decrease of Fi in the relevant phase. As the fault gets worse, it will start affecting adjacent phases. Usually, this occurs when the fault is located in one winding or between windings in the same phase. A very slight change in capacitance in the circuit can be detected and thus allows detection of faults in individual turns.

A second method uses a relationship between two currents or impedances at two frequencies, fn and 2 fn=(frequency doubling). When the frequency is doubled small changes in capacitance between individual turns or between phases will be enhanced and cause a change of IF in at least one phase (see calculation of IF and ZF below). The combination of phase angle Fi and IF allows the detection of most types of faults. Normal values for IF should be in the range of −15% to −50%.

Insulation resistance (INS), which is used to detect any insulation faults between windings and earth/motor casing.

Below is an example of calculations of relative measurands according to the present invention.

Noise voltage level (Uemi): The measurement result is presented as the absolute mean in mV or as the noise signal/useful signal ratio in dB.=20 log(Uemi/Usig).

Resistance (R): R_A, R_BC and R_CA is presented as the absolute resistance in the range of 0.00 mΩ-999Ω or as R deviation between phases expressed in % and calculated according to the following:

R_dev1=abs((R_AB−R_BC/R_AB)*100)
R_dev2=abs((R_BC−R_CA/R_BC)*100)
R_dev3=abs((R_CA−R_AB/R_CA)*100)

Phase angle (Fi): is the phase shift between the current and the voltage in the range of 0-90.0 degrees. Fi difference between the phases expressed in degrees at measuring frequency=fn is calculated according to the following:

Fi_diff1_fn=abs(Fi_AB_fn−Fi_BC_fn)
Fi_diff2_fn=abs(Fi_BC_fn−Fi_CA_fn)
Fi_diff3_fn=abs(Fi_CA_fn−Fi_AB_fn)

Impedance (Z): Z deviation between phases expressed in % at measuring frequency=fn is calculated according to the following:

Z_dev1_fn=abs((Z_AB_fn−Z_BC_fn/Z_AB_fn)*100)
Z_dev2_fn=abs((Z_BC_fn−Z_CA_fn/Z_BC_fn)*100)
Z_dev3_fn=abs((Z_CA_fn−Z_AB_fn/Z_CA_fn)*100)

Inductance (L): L deviation between phases expressed in % at measuring frequency=fn is calculated according to the following:

L_dev1_fn=abs((L_AB_fn−L_BC_fn/L_AB_fn)*100)
L_dev2_fn=abs((L_BC_fn−L_CA_fn/L_BC_fn)*100)
L_dev3_fn=abs((L_CA_fn−L_AB_fn/L_CA_fn)*100)

IF and ZF: The results of IF and ZF are equivalent to one another but calculated slightly differently. To calculate IF or ZF, values of the current I or the impedance Z at two measuring frequencies, fn and 2fn, are used. The functions IF and ZF are expressed in %, from 0 to −50%, and calculated according to the following:

IF_AB_fn=((I_AB__2fn−I_AB_fn)/I_AB_fn)*100
IF_BC_fn=((I_BC__2fn−I_BC_fn)/I_BC_fn)*100
IF_CA_fn=((I_CA__2fn−I_CA_fn)/I_CA_fn)*100
ZF_AB_fn=((Z_AB_fn−Z_AB__2fn)/Z_AB__2fn)*100
ZF_BC_fn=((Z_BC_fn−Z_BC__2fn)/Z_BC__2fn)*100
ZF_CA_fn=((Z_CA_fn−Z_CA__2fn)/Z_CA__2fn)*100

IF and ZF differences between the phases at measuring frequency=fn are calculated according to the following:

IF_diff1_fn=abs(IF_AB_fn−IF_BC_fn)
IF_diff2_fn=abs(IF_BC_fn−IF_CA_fn)
IF_diff3_fn=abs(IF_CA_fn−IF_AB_fn)
ZF_diff1_fn=abs(ZF_AB_fn−ZF_BC_fn)
ZF_diff2_fn=abs(ZF_BC_fn−ZF_CA_fn)
ZF_diff3_fn=abs(ZF_CA_fn−ZF_AB_fn)

Insulation resistance (INS): The measurement results are presented as the absolute insulation resistance in the range of 0.00 MΩ-500 MΩ.

Following automatically effected measurements and calculations of measurands according to the above, the operator is presented with two options:

The first is to manually study the values presented in graphic or numeric form. Graphic illustration of the calculated deviations and differences between the three phases is obtained by means of a specially designed system in which each deviation or difference is represented by a graphic symbol that changes both position and appearance depending on the extent of the deviations or differences, thus allowing the operator to instantly see the relationships between the phases and, at the same time, also read the rounded-off values in the same symbol position.

Figure 4:
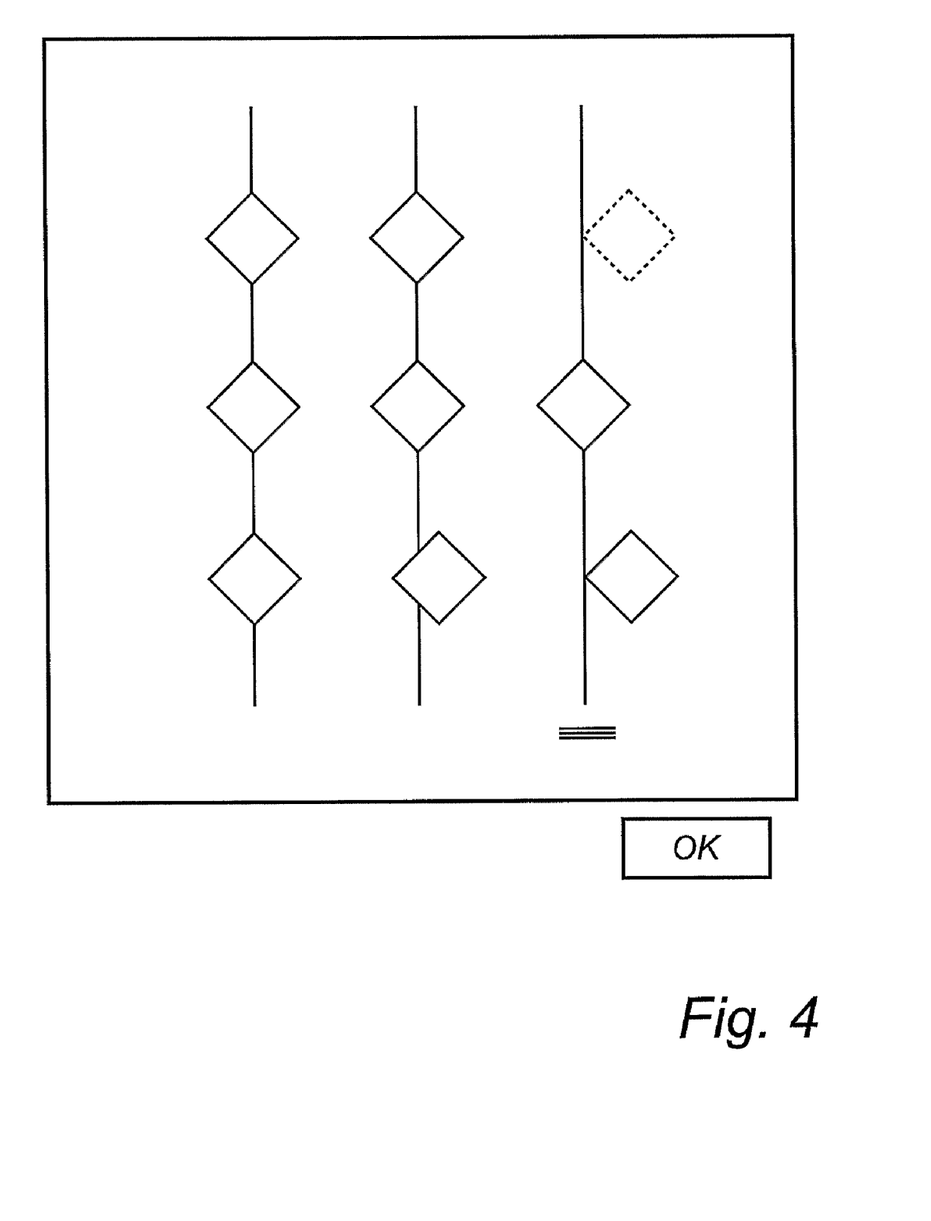
FIG. 4 is a schematic illustration of a pattern representing vertically arranged groups of quantities related to different phases.

Referring to FIG. 4, each quantity is presented in vertically arranged groups of three, for example (R_dev1, R_dev2, R_dev3). To see the numeric values, the operator can press OK when the cursor is below the selected quantity group. In the left group in FIG. 4, the differences between the phases for the selected one of the quantities outlined above is less than 1%, which means that the symbol on the screen are disposed along a vertical line. In the middle group, the value of the quantity deviates for the bottom phase 1-2%, which is illustrated as an offset of the symbol to the left or to the right depending on the sign of the deviation. In the right group, the value of the quantity deviates for the lowest phase 2-3%, which is illustrated by the symbol being located at the side of the vertical line. The value of the quantity measured for the top phase deviates more than 5%, which is illustrated by the symbol being drawn using thinner or broken lines. The percentages given above may, of course, vary depending on the kind of quantity to be measured and the intended test object.

The second option is to have the apparatus interpret and analyse, in its software or hardware, the results according to a previously given set of rules and relationships according to the following:

If Fi,IF,Z,L are OK and R_dev >3-5=>Check wiring technique, otherwise possible contact fault or open turn in delta-connected motor.

If Fi_diff_fn >1 and IF_diff_fn >2=>Insulation fault between turns of the same winding.

If Fi_diff_fn >1 and IF_diff_fn <2=>Insulation fault between windings in the same phase.

If Fi_diff_fn <1 and IF_diff_fn >2=>Insulation faults between windings in different phases.

If any IF_diff_fn >5=>Indicates serious short circuit.

If INS<1.5-5 MΩ=>Insulation fault between windings and earth/motor casing.

If Z and L are parallel=> Windings are not contaminated.

If Z and L are not parallel=>Windings are contaminated.

If Z follows R, Fi, and IF but L deviates>3=>Possible rotor fault, rotor test to be carried out.

The invention claimed is:

1. A method for off-line testing of an electric motor, which comprises stator windings and a rotor arranged along a rotation axis, comprising measuring a physical quantity of the stator winding while the rotor is being rotated about the rotation axis, wherein periodic measuring data concerning the physical quantity are obtained, characterized by;
    applying a periodical test signal to at least one of the stator windings;
    collecting first measuring data from one or more waveform periods of the test signal;
    detecting peak values of the collected first measuring data;
    forming second measuring data based on the detected peak values of the first measuring data;
    comparing the symmetry between at least the fundamentals of two or more half-cycles of the collected second measuring data; and
    generating a signal, which indicates the symmetrical relationship between at least the fundamentals of two or more half-cycles of the collected second measuring data.

2. A method according to claim 1, wherein a test signal is applied to at least one stator winding in the electric motor, wherein the periodic measuring data are obtained by measuring across the stator winding connections while the rotor is being rotated about the rotation axis.

3. A method according to claim 1, wherein the measured physical quantity is the current through the stator winding (I), the impedance of the stator winding (Z) and/or the inductance of the stator winding (L).

4. An apparatus for off-line testing of an electric motor, which motor comprises stator windings and
    a rotor arranged along a rotation axis, the apparatus being arranged to measure a physical quantity of the stator winding while the rotor is being rotated about the rotation axis, whereby periodic measuring data concerning the physical quantity are obtained, characterized in that the apparatus is arranged to;

apply a periodical test signal to at least one of the stator windings, collect first measuring data from one or more waveform periods of the test signal, detect peak values of the collected first measuring data, form second measuring data based on the detected peak values of the first measuring data;

compare the symmetry between at least the fundamentals of two or more half-cycles of the collected second measuring data, generate a signal, which indicates the symmetrical relationship between at least the fundamentals of two or more half-cycles of the collected second measuring data.

* * * * *